United States Patent [19]
Ueno

[11] Patent Number: 5,942,920
[45] Date of Patent: Aug. 24, 1999

[54] DUAL BUFFER PEAK DETECTING APPARATUS

[75] Inventor: Isamu Ueno, Hadano, Japan

[73] Assignee: Canon Kabushiki Kaisha, Tokyo, Japan

[21] Appl. No.: 08/789,871

[22] Filed: Jan. 28, 1997

[30] Foreign Application Priority Data

Jan. 31, 1996 [JP] Japan ................................ 8-015676

[51] Int. Cl.$^6$ .......................... H03K 17/62; H04B 17/00
[52] U.S. Cl. ............................. 327/58; 327/62; 327/77; 327/71; 327/483
[58] Field of Search ................................ 327/58, 50, 69, 327/63, 71, 79, 336, 62, 77, 483; 330/29

[56] References Cited

U.S. PATENT DOCUMENTS

| | | | |
|---|---|---|---|
| 3,719,895 | 3/1973 | Skala | 330/29 |
| 4,937,670 | 6/1990 | Whitledge | 327/58 |
| 4,942,314 | 7/1990 | Hosoya et al. | 327/91 |
| 5,302,863 | 4/1994 | Walley et al. | 327/60 |
| 5,343,479 | 8/1994 | Kiyozuka | 327/58 |

FOREIGN PATENT DOCUMENTS 362034416A  2/1987  Japan ........................................ 327/58

OTHER PUBLICATIONS

S. Hutton, "Peak Indicator," Electronics and Wireless World, v. 91, No. 1588 (Feb. 1985).
C. Claassen et al., "Transient Measuring Sample and Hold Detector," I.B.M. Technical Disclosure Bulletin, v. 12, No. 8, (Jan. 1970).
J. Maillet, "Peak Detector," I.B.M. Technical Disclosure Bulletin, v. 19, No. 4 (Sep. 1976).

*Primary Examiner*—Dinh T. Le
*Attorney, Agent, or Firm*—Fitzpatrick Cella Harper & Scinto

[57] ABSTRACT

To solve a problem that, as the number of signal sources for outputting peak values decreases, a peak output voltage decreases, and to improve detecting precision, there are provided a plurality of first buffer units [$Q_{11} \cdot Q_{21} \cdot M_{31}$ to $Q_{13} \cdot Q_{23} \cdot M_{33}$], which are emitter-follower circuits, to each of which a signal is input, a plurality of second buffer units [$Q_{31}$ to $Q_{33}$] which are respectively connected to the first buffer units and an output unit for outputting the detected peak signal.

6 Claims, 11 Drawing Sheets

DUAL BUFFER PEAK DETECTING APPARATUS

BACKGROUND OF THE INVENTION

1. Field of the Invention

The invention relates to a peak detecting apparatus and, more particularly, to a peak detecting apparatus for detecting peak values of signals from a plurality of signal sources.

2. Related Background Art

Figure 10:
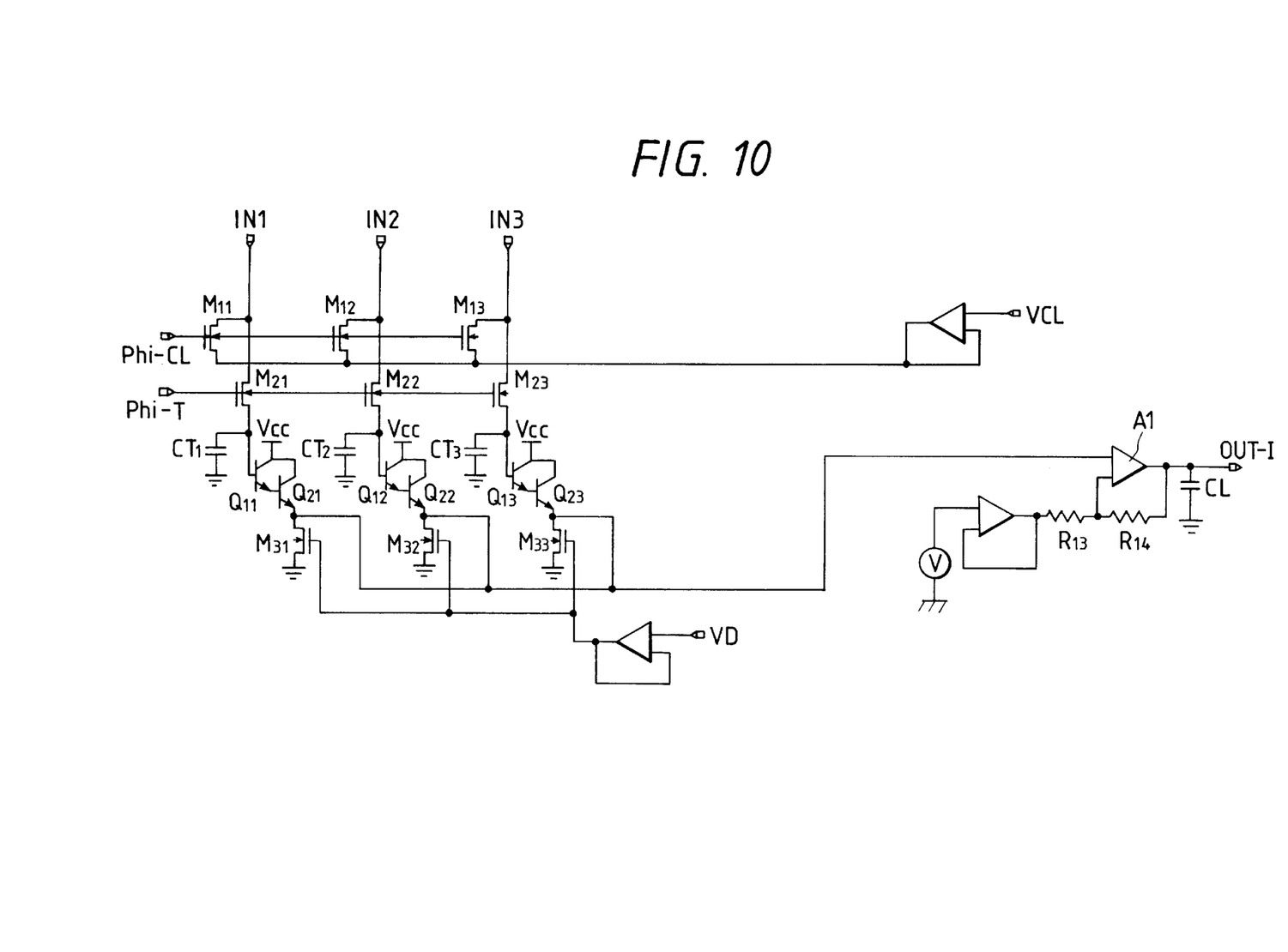
FIG. 10 is a circuit constructional diagram of a conventional peak detecting apparatus.

Hitherto, as an apparatus for detecting peak values of signals from a plurality of signal sources, a circuit shown in FIG. 10 has been proposed (Japanese Patent Application No. 7-167407 or the like).

In FIG. 10, $IN_1$ to $IN_3$ denote input terminals which are connected to signal sources. The input terminals are connected to holding capacitors $CT_1$ to $CT_3$ and Darlington type emitter-follower circuits $Q_{11} \cdot Q_{21} \cdot M_{31}$ to $Q_{13} \cdot Q_{23} \cdot M_{33}$, which are buffer means, through switching means $M_{21}$ to $M_{23}$, respectively. $M_{11}$ to $M_{13}$ denote reset means. Output sides of the buffer means are commonly connected and output signals are increased by proper gain times by an amplifier $A_1$ and are outputted.

The above circuit, however, has a problem such that output values differ in dependence on the number of signal sources for generating peak values. When explaining it by using numerical expressions (it is now assumed that NPN transistors which are Darlington connected are set to one NPN transistor). Now, assuming that the number of signal sources $=N$ the number of signal sources for generating the peaks $=NP$ peak voltage value $=VP$ saturation current of the NPN transistor $=IS$ constant current value of the buffer means $=I$, a peak output voltage is $$V_{OUT}=VP-kT/q \cdot \ln(N \cdot I/NP \cdot IS)$$

As will be obviously understood from the above equation, in the foregoing circuit, there is no problem in the case where the signal, namely, VP (the first term of the above equation) is sufficiently larger than that of the second term. However, when the VP is small and the second term cannot be ignored, there is a problem such that as the number of signal sources for outputting the peak values is small, the output voltage decreases. A detecting precision is deteriorated.

SUMMARY OF THE INVENTION

It is an object of the invention to solve the problems of the conventional techniques as mentioned above.

According to the invention, there is provided a first peak detecting apparatus comprising: a plurality of first buffer means to each of which a signal is inputted; a plurality of second buffer means connected to the plurality of first buffer means; and a common output line for commonly connecting output sides of the plurality of second buffer means.

According to the invention, in the foregoing first peak detecting apparatus, there is provided a second peak detecting apparatus in which the plurality of first buffer means are constructed by emitter-follower circuits.

According to the invention, in the foregoing first or second peak detecting apparatus, there is provided a third peak detecting apparatus comprising a dummy output unit having the first buffer means which are connected to a voltage source and the second buffer means which are connected to the first buffer means, wherein a difference between an output from the common output line and an output from the dummy output unit is processed.

According to the invention, in any one of the foregoing first to third peak detecting apparatuses, there is provided a fourth peak detecting apparatus in which a capacitor is serially connected to an input side of each of the first buffer means to which the signals are inputted and reset means are connected between the input sides of the first buffer means and the capacitors.

According to the invention, in the foregoing third or fourth peak detecting apparatus, there is provided a fifth peak detecting apparatus in which reset means are provided on input sides of the first buffer means to which the signals are inputted and difference processing means for removing an electric potential of the common output line which was raised by a reset potential of the reset means is provided on the output side of the dummy output unit.

According to the invention, in any one of the foregoing first to fifth peak detecting apparatuses, there is provided a sixth peak detecting apparatus comprising: clamping means for clamping the signal that is outputted from the common output line; and comparing means for comparing a signal voltage from the clamping means and a reference voltage.

In the present invention, a peak detection incorporates not only a maximum value detection but also a minimum value detection.

The above and other objects and features of the present invention will become apparent from the following detailed description and the appended claims with reference to the accompanying drawings.

DETAILED DESCRIPTION OF THE PREFERRED EMBODIMENTS

Figure 11:
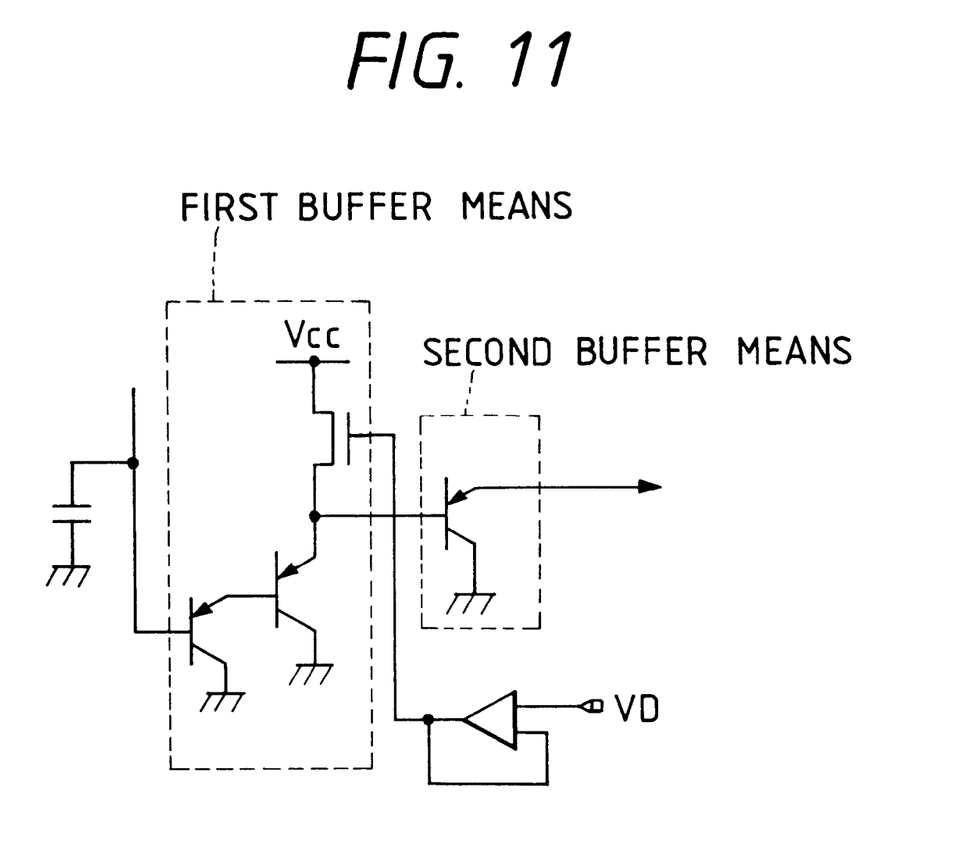
FIG. 11 is a partial circuit constructional diagram of a peak detecting apparatus in case of performing a minimum value detection.

Embodiments of the invention will now be described hereinbelow in detail with reference to the drawings. The embodiments which will be explained hereinbelow relate to apparatuses each for performing a maximum value detection. However, as shown in FIG. 11, by changing NPN transistors constructing first and second buffer means to PNP transistors, an apparatus for performing a minimum value detection can be easily constructed.

Figure 1:
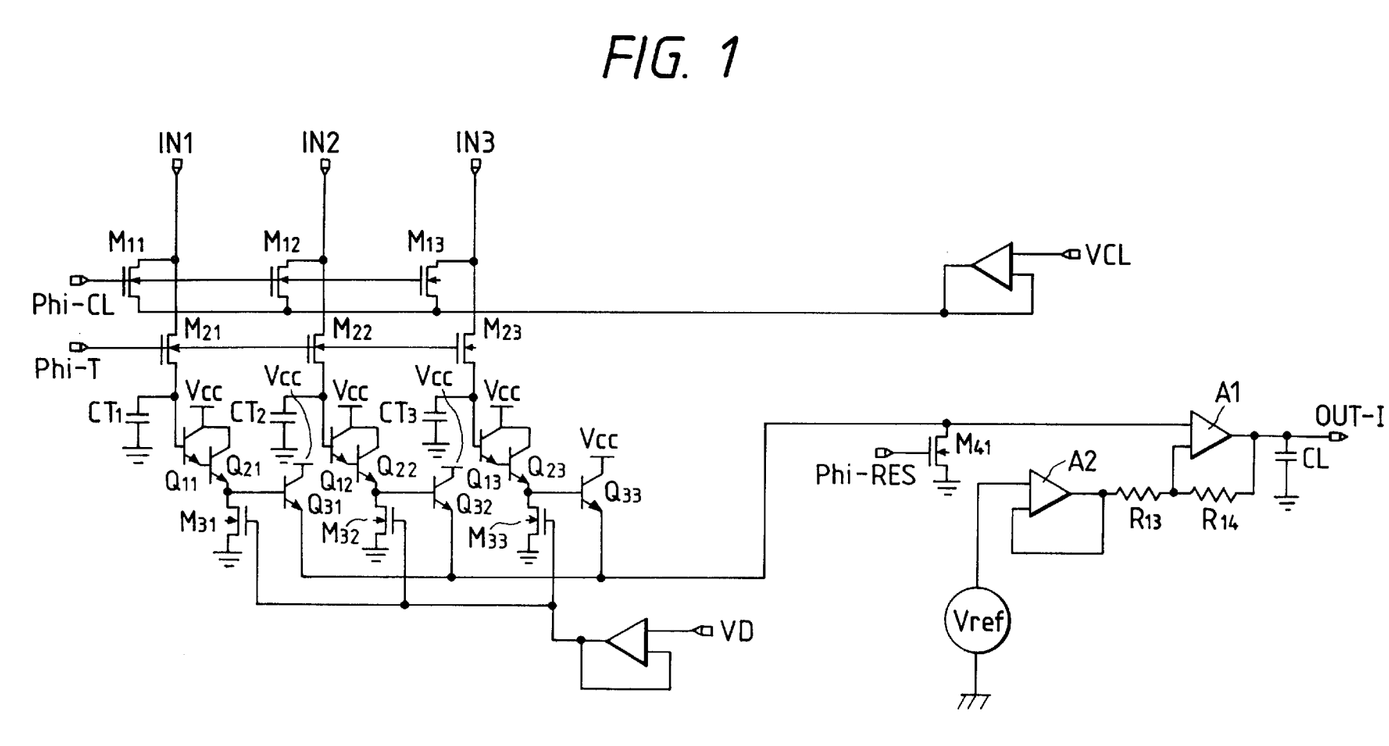
FIG. 1 is a circuit constructional diagram showing the first embodiment of a peak detecting apparatus of the invention.

FIG. 1 is a circuit constructional diagram showing the first embodiment of a peak detecting apparatus of the invention.

The embodiment relates to the peak detecting apparatus having three signal input terminals $IN_1$ to $IN_3$. Those input terminals are connected to the holding capacitors $CT_1$ to $CT_3$ and the Darlington type emitter-follower circuits $Q_{11} \cdot Q_{21} \cdot M_{31}$ to $Q_{13} \cdot Q_{23} \cdot M_{33}$, which are first buffer means, through the switching means $M_{21}$ to $M_{23}$, respectively. $M_{11}$ to $M_{13}$ denote the reset means connected to a reset voltage source (voltage $V_{CL}$).

The output sides of the first buffer means are connected to bases of NPN transistors $Q_{31}$ to $Q_{33}$ as second buffer means. Emitters of the NPN transistors $Q_{31}$ to $Q_{33}$ are commonly connected and a common emitter output is increased by proper gain times by the amplifier $A_1$ and is outputted. $M_{41}$ denotes reset means connected to a predetermined voltage source (GND here).

The operation of the foregoing peak detecting apparatus will now be described hereinbelow with reference to FIG. 1 and a timing chart of FIG. 2.

First, a terminal Phi-CL is set to the high (H) level until time $t_1$, thereby making the reset means $M_{11}$ to $M_{13}$ conductive and resetting the holding capacitors $CT_1$ to $CT_3$ to the voltage $V_{CL}$ (in this instance, a terminal Phi-T is also set to the H level and the switching means $M_{21}$ to $M_{23}$ are made conductive). At this time, a terminal Phi-RES is set to the H level and the common output line also maintains a predetermined reset potential.

When the terminal Phi-RES is reduced from the H level to the low (L) level at time $t_2$, the output voltage is raised by an emitter current of the transistors $Q_{31}$ to $Q_{33}$.

After that, when a signal is inputted to each of the input terminals $IN_1$ to $IN_3$ at time $t_3$, the signals are read out to the holding capacitors $CT_1$ to $CT_3$ through the switching means $M_{21}$ to $M_{23}$, respectively. The electric potential of the common output line rises in accordance with the maximum voltage among the signals inputted to the input terminals $IN_1$ to $IN_3$. A peak voltage of the signal from each signal source is generated from the amplifier $A_1$. This is because since base potentials of the NPN transistors $Q_{31}$ to $Q_{33}$ serving as second buffer means depend on a magnitude of the signal from each signal source, when the electric potential of the common output line rises, the transistors other than the transistor to which the signal at the peak level was inputted is made nonconductive due to a drop of a base-emitter voltage.

Further, at time $t_4$ just before each signal trails, the terminal Phi-T is reduced from the H level to the L level, the switching means $M_{21}$ to $M_{23}$ are made nonconductive, and their signals are held in the holding capacitors $CT_1$ to $CT_3$, respectively. The signals trail at time $t_5$. Further, at time $t_6$, the terminal Phi-RES is raised from the L level to the H level and the common output line is reset.

By the above operation, the peak voltage of the signal from each signal source can be accurately generated from the amplifier $A_1$ connected to the common output line.

In the peak detecting apparatus of the embodiment, the common output line is not directly connected to the first buffer means because it is connected to the first buffer means through the second buffer means. Even if the number of signal sources for outputting the peak values changes, a situation such that the output values differ as in the conventional peak detecting apparatus shown in FIG. 10 doesn't occur.

In the first embodiment, now assuming that a peak signal voltage of the input terminals $IN_1$ to $IN_3$ is equal to $V_P$, an input voltage of the amplifier $A_1$ at the time of the signal output is almost equal to $V_P - 3V_{BE}$ ($V_{BE}$: voltage between the base and emitter of the NPN transistor). Now, assuming that a reference voltage of the amplifier $A_1$ is equal to $V_{ref}$ and a gain is equal to A, an output voltage of the amplifier $A_1$ is $$V_{OUT} = A(V_P - 3V_{BE}) + (1-A)v_{ref}$$

Therefore, when the gain is set to a high value of tens of times or more or in case of forming the reference power source $V_{ref}$ in an IC or the like, there is a case where input/output ranges of the amplifier $A_1$ largely fluctuate due to a variation or the like of the device. The second embodiment can solve such a problem.

Figure 3:
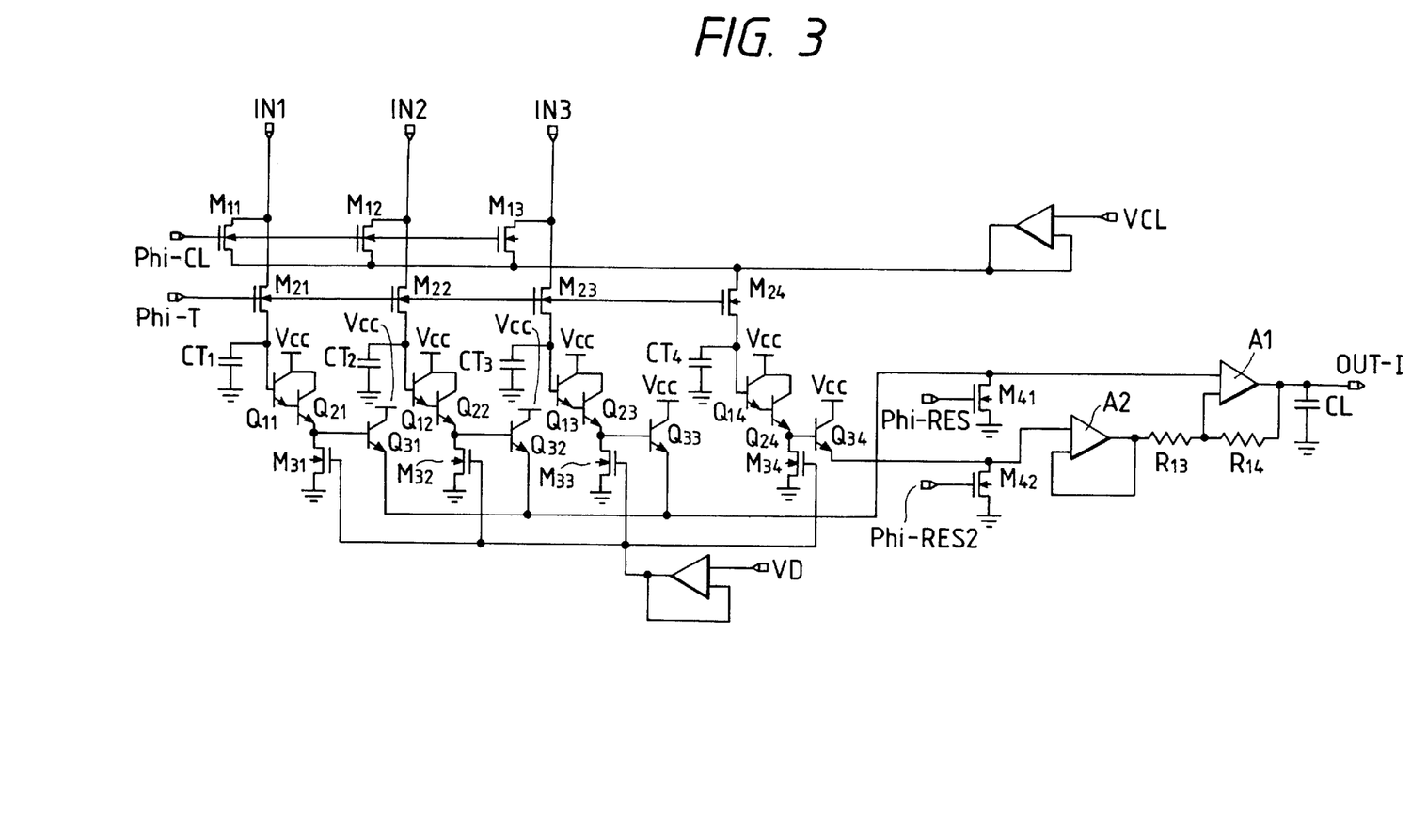
FIG. 3 is a circuit constructional diagram showing the second embodiment of a peak detecting apparatus of the invention.

FIG. 3 is a circuit constructional diagram showing the second embodiment of a peak detecting apparatus of the invention.

According to the embodiment, a dummy output unit is further added to the circuit connected to the three signal input terminals $IN_1$ to $IN_3$ in the embodiment shown in FIG. 1, thereby generating a differential signal as an output between the peak value of the three input signals and a dummy signal.

In FIG. 3, one terminal of switching means $M_{24}$ is connected to the reset power source (voltage $V_{CL}$) and another terminal is connected to a holding capacitor $CT_4$ and a Darlington type emitter-follower circuit $Q_{14} \cdot Q_{24} \cdot M_{34}$ which are third buffer means. An output side of the third buffer means is connected to a base of an NPN transistor $Q_{34}$ as fourth buffer means. An emitter of the NPN transistor $Q_{34}$ is connected to an output line other than the common output line and is connected to an amplifier $A_2$. According to the second embodiment, a reference power source V connected to the amplifier $A_2$ in the embodiment of FIG. 1 is replaced by an output voltage from the dummy output unit and the other component elements are similar to those of the peak detecting apparatus of the embodiment of FIG. 1. Conducting and nonconducting operations of the switching means $M_{24}$ are controlled in a manner similar to the switching means $M_{21}$ to $M_{23}$ and a terminal Phi-RES2 is set to the H level. Since the terminal Phi-RES2 is now set to the H level, switching means $M_{42}$ is always conducting and a variation in characteristics of a DC level is eliminated. However, the variation in characteristics can be also eliminated by making the terminal Phi-RES2 nonconductive as necessary.

Thus, the characteristics variation of each device can be autonomously corrected and the stable output DC level can be derived.

Figure 4:
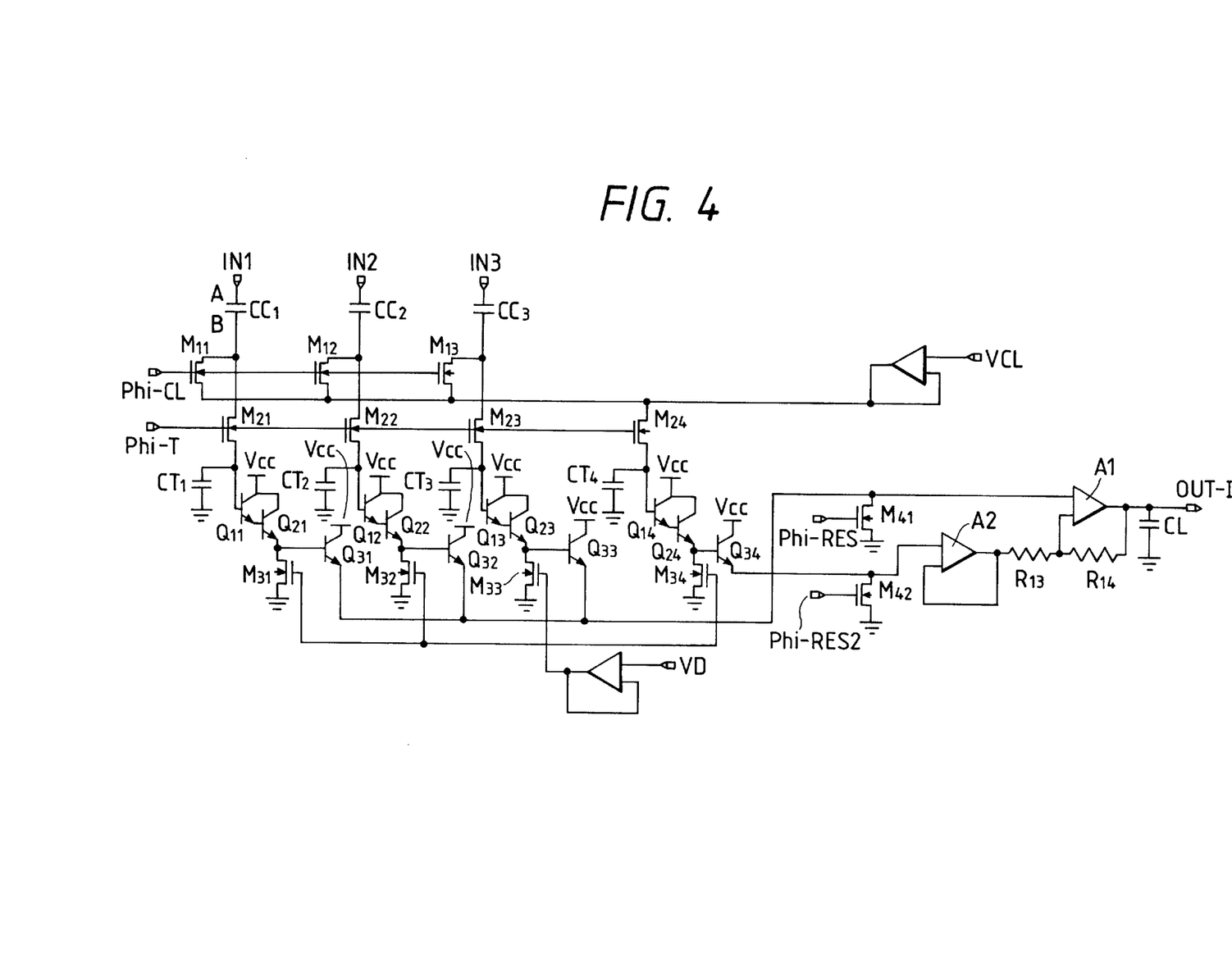
FIG. 4 is a circuit constructional diagram showing the third embodiment of a peak detecting apparatus of the invention.

FIG. 4 is a circuit constructional diagram showing the third embodiment of a peak detecting apparatus of the invention. According to the embodiment, a capacitor is added to each signal input line of the peak detecting apparatus of the embodiment shown in FIG. 3 and when two signals are time-sequentially inputted from signal sources to an input terminal, a difference between those signals is processed and a peak of a differential signal is generated. It will be obviously understood that a process to add the capacitor to each signal input line can be also performed to the peak detecting apparatus in the embodiment shown in FIG. 1.

As shown in FIG. 4, capacitors $CC_1$ to $CC_3$ are connected to the signal input terminals $IN_1$ to $IN_3$. A differential processing operation will now be described hereinbelow on the assumption that two signals are time-sequentially inputted to the signal input terminal $IN_1$. An electrode on the signal input terminal side of the capacitor $CC_1$ assumes A and an electrode on the output side assumes B.

First, the reset means $M_{11}$ is made conductive, the electrode B of the capacitor $CC_1$ is set to the reset potential $V_{CL}$, a first signal is inputted to the electrode A of the capacitor $CC_1$, and its electric potential assumes $V_1$. Subsequently, the reset means $M_{11}$ is made nonconductive and the electrode B of the capacitor $CC_1$ is set into a floating state. When the signal on the electrode A side of the capacitor $CC_1$, is once reset (GND potential), the voltage of the electrode B is set to $(V_{CL}-V_1)$. After that, when a second signal $(V_2)$ is inputted, the electric potential of the electrode B of the capacitor $CC_1$ also rises by an amount corresponding to the fluctuation potential and the electric potential is set to $(V_{CL}-V_1+V_2)$. Since $V_{CL}$ can be arbitrarily set, the signal of $(-V_1+V_2)$ can eventually be outputted from the capacitor $CC_1$. Now, assuming that the signal source is a photosensor and the first signal is a noise from the photosensor and the second signal is a sensor signal including the noise, a sensor signal from which a noise component was eliminated can be outputted from the capacitor $CC_1$.

Figure 5:
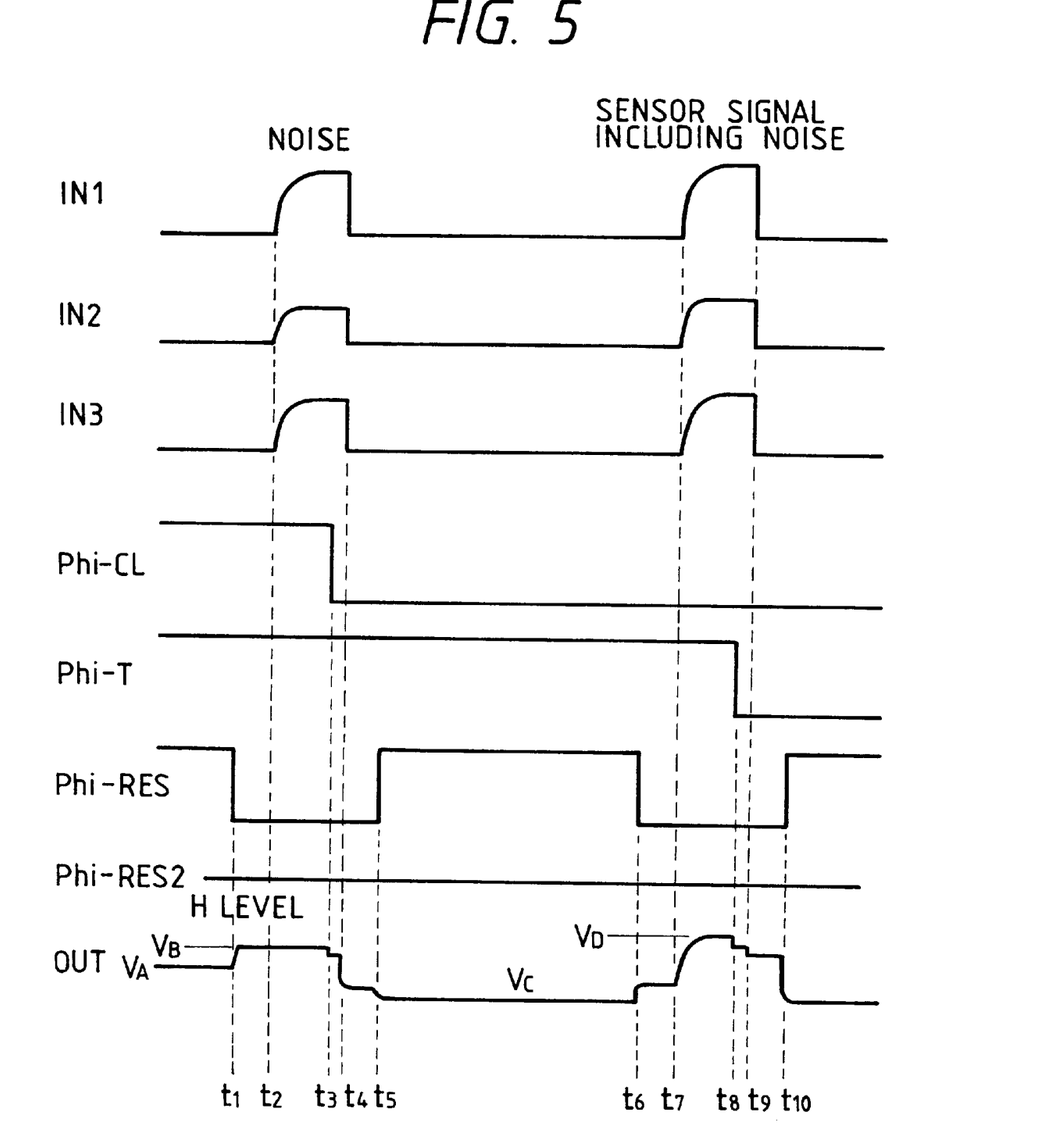
FIG. 5 is a diagram showing a timing chart when a noise and a sensor signal including the noise are inputted to input terminals $IN_1$ to $IN_3$.

FIG. 5 is a diagram showing a timing chart when a noise and a sensor signal including the noise are sequentially inputted to the input terminals $IN_1$ to $IN_3$.

Figure 6A:
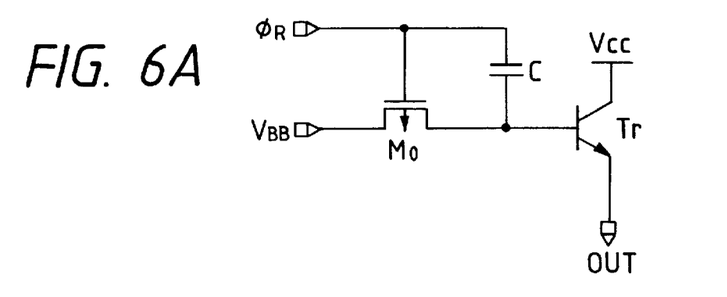
FIGS. 6A to 6C are diagrams showing constructions of photosensors each for time-sequentially outputting a noise and a sensor signal including the noise.
Figure 6B:
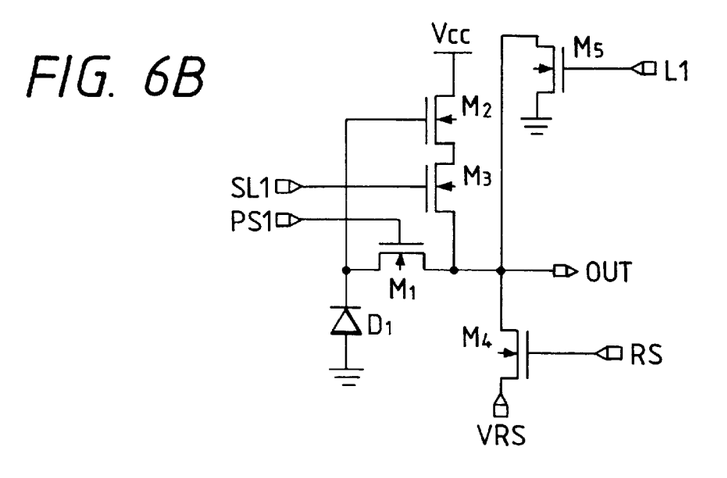
Figure 6C:
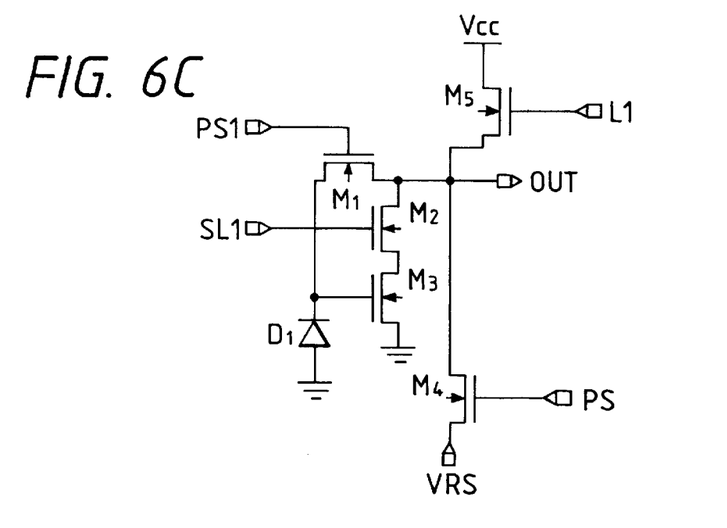

As a photosensor for time-sequentially generating the noise and the sensor signal including the noise, for example, there are a bipolar type sensor shown in FIG. 6A and MOS type sensors shown in FIGS. 6B and 6C. The bipolar type sensor is a sensor such that charges which were photoelectrically converted are accumulated into a base and a signal corresponding to the accumulated charges is read out from an emitter. The MOS type sensor is a sensor such that charges which were photoelectrically converted are accumulated in a gate and a signal corresponding to the accumulated charges is read out from a source. An output form of FIG. 6B is set to a source follower. An output form of FIG. 6C is set to an inverting amplifier.

In the bipolar type sensor shown in FIG. 6A, first, a P-channel MOS type transistor $M_0$ is made conductive, a base potential is set to a predetermined potential, further, an emitter is set to a fixed potential, the base potential is raised through a capacitor C, and a portion between a base and an emitter of a bipolar transistor Tr is forwardly biased, thereby refreshing (refreshing operation). Subsequently, the emitter is disconnected from a fixed power source, the base potential is again raised through the capacitor C, the noise is read out from the emitter (noise reading operation), the refresh is again executed (refreshing operation), the charges which were photoelectrically converted are accumulated into the base (accumulating operation), and the signal corresponding to the charges accumulated is read out from the emitter (signal reading operation) in a manner similar to the noise reading operation.

In the MOS type sensor shown in FIG. 6B, first, MOS transistors $M_1$ and $M_4$ are turned on and charges remaining in a photodiode $D_1$ and a gate of an MOS transistor $M_4$ are reset (resetting operation). Subsequently, the MOS transistors $M_1$ and $M_4$ are turned off and MOS transistors $M_3$ and $M_5$ are turned on. A signal (noise) just after the resetting is read out (noise reading operation) by an amplifier (source follower) constructed by the MOS transistors $M_2$, $M_3$, and $M_5$. Subsequently, the resetting is again executed (resetting operation). The MOS transistor $M_1$, is turned off and charges which were photoelectrically converted in the photodiode $D_1$ are accumulated in the gate of the MOS transistor $M_2$ (accumulating operation). In a manner similar to the noise reading operation, a current corresponding to the charges accumulated in the gate of the MOS transistor $M_2$ flows and the signal is read out (signal reading operation).

In the MOS type sensor shown in FIG. 6C, first, the MOS transistors $M_1$ and $M_4$ are turned on and charges remaining in the photodiode $D_1$ and a gate of the MOS transistor $M_3$ are reset (resetting operation). Subsequently, the MOS transistors $M_1$ and $M_4$ are turned off, the MOS transistors $M_2$ and $M_4$ are turned on, and a signal (noise) just after the resetting is read out by an inverting amplifier constructed by the MOS transistors $M_2$, $M_3$, and $M_5$ (noise reading operation). Subsequently, a resetting is again executed (resetting operation), the MOS transistor $M_1$ is turned off, and charges which were photoelectrically converted in the photodiode $D_1$ are accumulated in the gate of the MOS transistor $M_3$ (accumulating operation). In a manner similar to the noise reading operation, a current corresponding to the charges accumulated in the gate of the MOS transistor $M_3$ flows and a signal is read out (signal reading operation).

The photosensor for time-sequentially generating the noise and the sensor signal including the noise has been described above. However, in such a photosensor, if there is no need to read out the noise, the noise reading operation and the subsequent resetting operation (or refreshing operation) can be omitted. In such a case, the photosensor can be also obviously used as a signal source in the embodiments 1 and 2.

Figure 7:
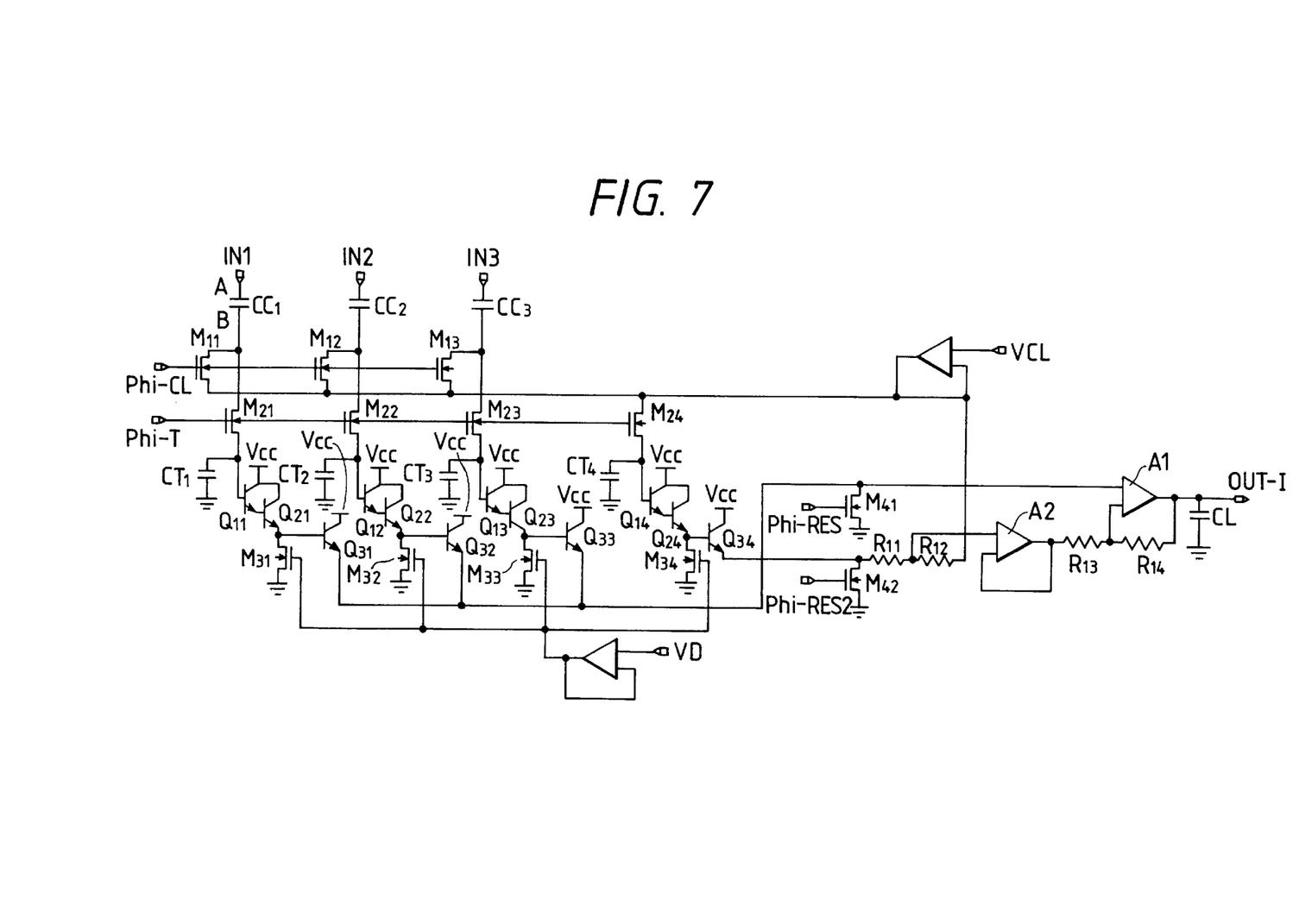
FIG. 7 is a circuit constructional diagram showing the fourth embodiment of a peak detecting apparatus of the invention.

FIG. 7 is a circuit constructional diagram showing the fourth embodiment of a peak detecting apparatus of the invention. According to the embodiment, in the peak detecting apparatus shown in FIG. 4, when the terminal Phi-RES is first set to the L level, an output voltage rises and, after that, a signal component is further read out. Therefore, when a voltage difference between an output of a dummy cell and a signal output is large and a gain of a gain amplifier at the post stage is so high to be tens of times, there is a case where the amplifier is saturated. As shown in FIG. 7, in the embodiment, a reset voltage source and an output line of a dummy output unit are connected through two serial resistors and are connected to a buffer amplifier by dividing resistances, thereby raising an output of the dummy cell, reducing a differential voltage between them, and preventing a saturation of the amplifier.

Figure 2:
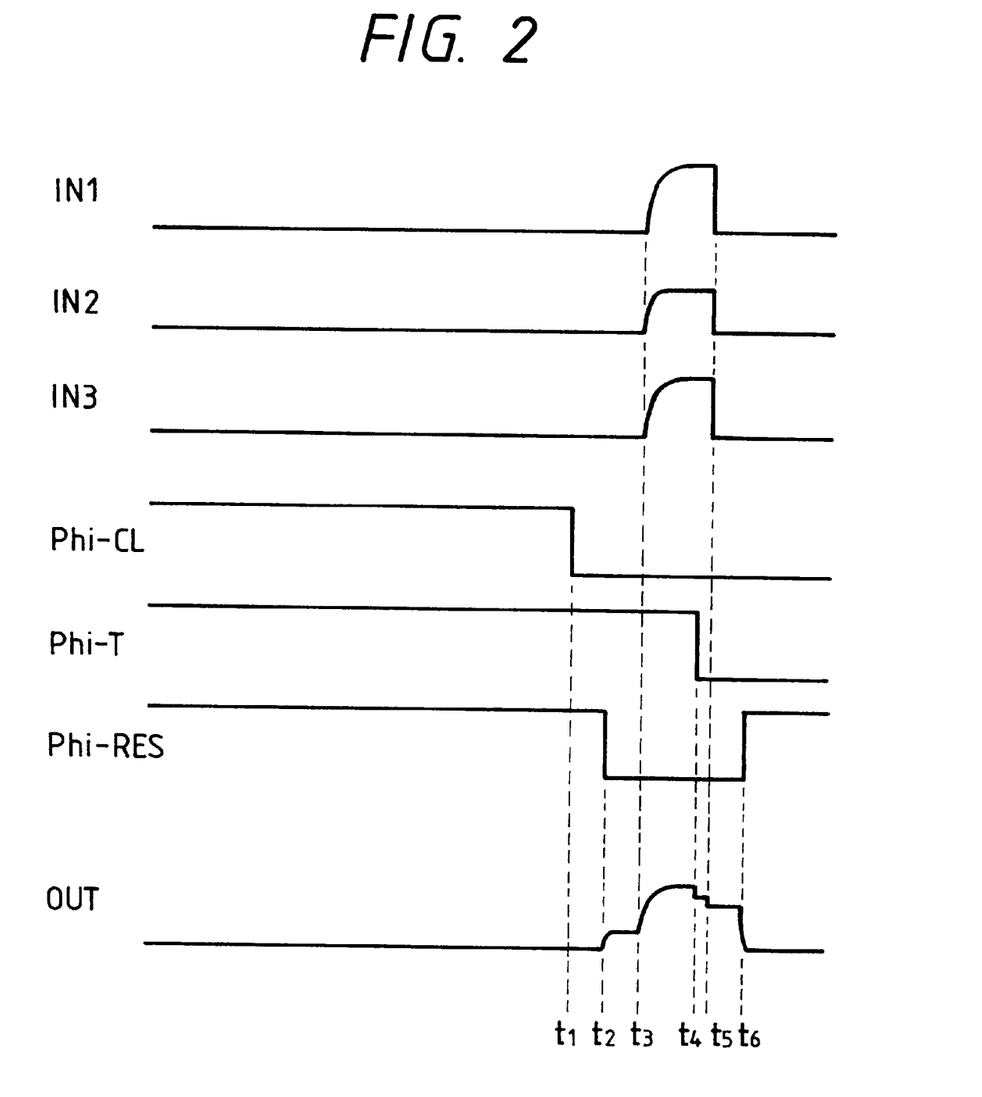
FIG. 2 is a timing chart for explaining the operation of the peak detecting apparatus.

For example, from time $t_2$ in FIG. 2 showing the operation of the peak detecting apparatus of the embodiment 1, the terminal Phi-RES is set to the L level and an output voltage is increased by an emitter current of the transistors $Q_{31}$ to $Q_{33}$. In the embodiment, however, the reset voltage is resistance divided and an output voltage is formed and a differential signal between both of the output voltages is generated, the output voltage of the amount raised by the emitter current of the transistors $Q_{31}$ to $Q_{33}$ can be eliminated.

Figure 8:
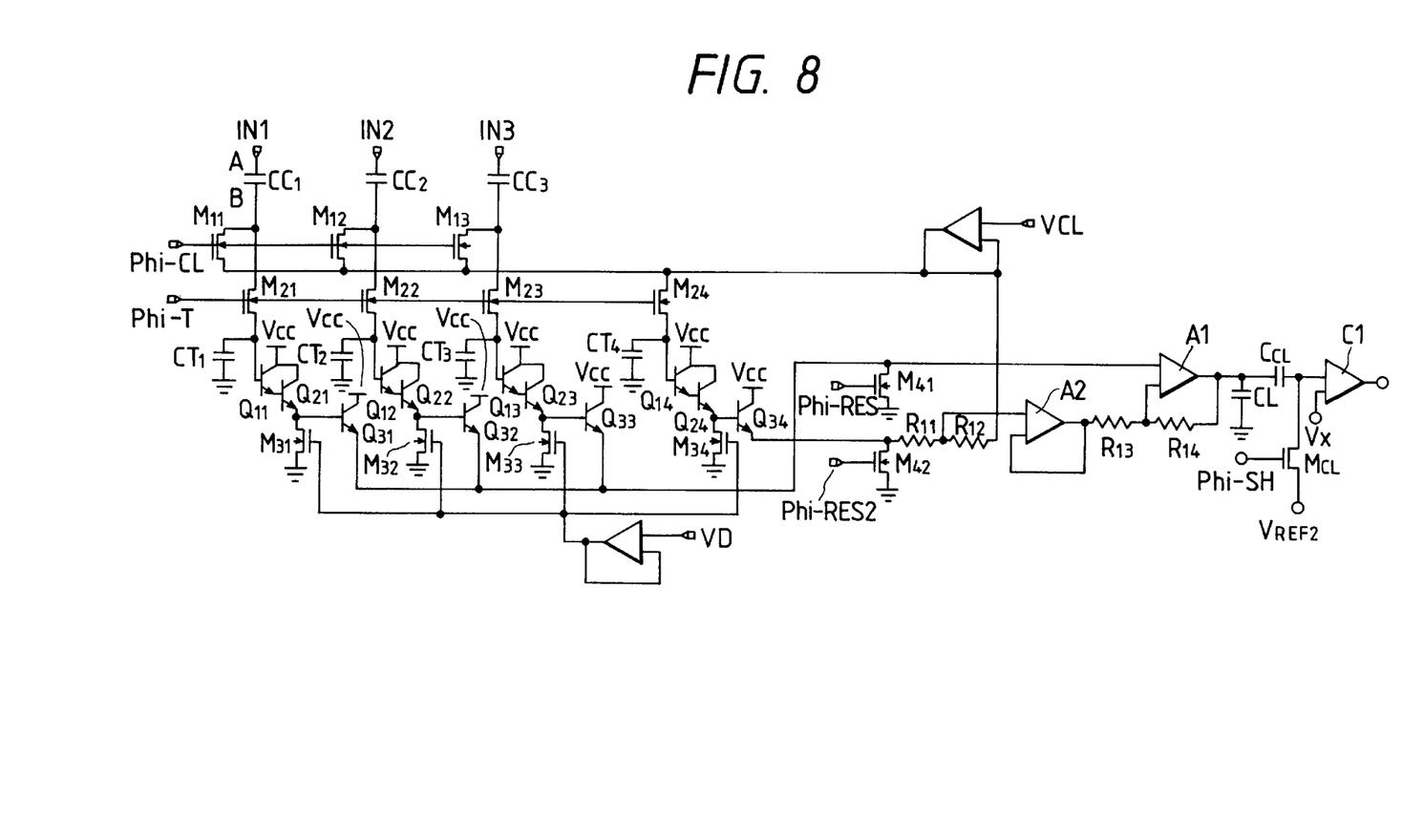
FIG. 8 is a circuit constructional diagram showing the fifth embodiment of a peak detecting apparatus of the invention.

FIG. 8 is a circuit constructional diagram showing the fifth embodiment of a peak detecting apparatus of the invention. In FIG. 8, a clamping circuit constructed by a capacitor $C_{CL}$ and an MOS transistor $M_{CL}$ is connected to the final output stage of the peak detecting apparatus of the fourth embodiment shown in FIG. 7 and a comparator $C_1$ is connected to an output of the clamping circuit.

The same control signal as a control signal (reset signal) that is applied to the terminal Phi-CL is supplied to a terminal Phi-SH which is connected to a gate of the MOS transistor $M_{CL}$. Namely, when the holding capacitors $CT_1$ to $CT_3$ and the like are reset, an electric potential on the output side of the capacitor $C_{CL}$ (connecting side to the comparator $C_1$) is set to $V_{REF2}$. When the signal is outputted, a peak voltage of the signal from which the noise component is eliminated is clamped and inputted to the comparator $C_1$. In the comparator $C_1$, the clamped peak voltage and a reference voltage $V_X$ are compared. Since an output state is set to ON or OFF in accordance with magnitudes of both voltages, whether the peak voltage has exceeded the reference voltage $V_X$ or not can be detected. The peak detecting apparatus of the embodiment, therefore, is preferably used in an application as a detector. The embodiment has been shown and described with respect to the case where the clamping circuit and comparator are connected to the final output stage of the peak detecting apparatus of the embodiment 4. However, it will be obviously understood that the clamping circuit and comparator can be also connected to the final output stage of the peak detecting apparatus in each of the embodiments 1 to 3.

Figure 9:
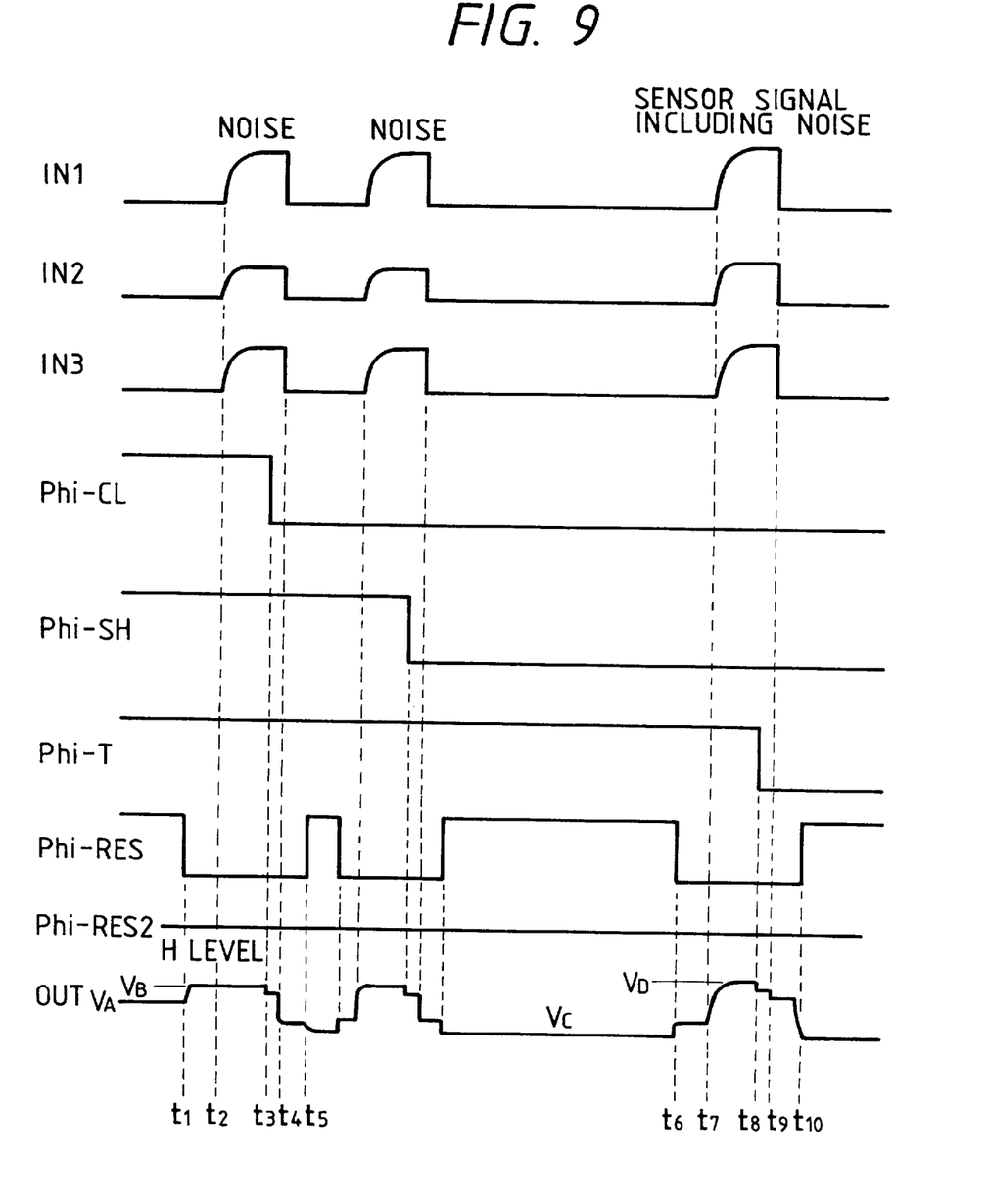
FIG. 9 is a timing chart of a peak detecting apparatus of the sixth embodiment of the invention.

The sixth embodiment relates to the improvement of the peak detecting apparatus of the fifth embodiment. FIG. 9 is a timing chart of a peak detecting apparatus of the embodiment.

As shown in the diagram, in the embodiment, the noise reading operation is executed twice. The first noise reading operation is executed to hold the noise signal into the capacitors $CC_1$ to $CC_3$ and capacitors $CT_1$ to $CT_3$. The next noise reading operation is executed to decide a clamping voltage of the clamping circuit at the front stage of the comparator $C_1$. A circuit construction of the peak detecting apparatus in the embodiment is similar to that of FIG. 8.

In FIG. 5, a waveform at an output terminal OUT when the noise is read out and that when the sensor signal including the noise is read out are different. In the former case, the noise is read out from $V_A$ to $V_B$. In the latter case, the sensor signal is read out from $V_C$ to $V_D$ (when the sensor signal is set to 0, $V_B=V_D$). The emitter voltage of the NPN transistors $Q_{31}$ to $Q_{33}$ at the front stage of the amplifier also has a shape similar to the foregoing waveform. Therefore, operating regions of the transistors are different in both cases. When the sensor signal is very small, it is also considered that a detection error based on it occurs. In the embodiment, for both of the signal reading periods, the noise reading operation is added and on the basis of an output voltage at this time, a comparing operation is executed at the final stage. Operating points of the reading circuit including $Q_{31}$ to $Q_{33}$ at the time of the second noise reading operation and at the time of the second reading operation of the sensor signal including the noise coincide and the accurate detection can be performed.

The operation of the peak detecting apparatus of the embodiment will now be described hereinbelow with reference to FIGS. 8 and 9. The operation of the dummy output unit is omitted here for simplicity of explanation.

As shown in FIG. 9, at time $t_2$ when the terminals Phi-CL and Phi-T are at the H level and the reset means $M_{11}$ to $M_{13}$ and switching means $M_{21}$ to $M_{23}$ are conductive, when the first noise reading operation is executed, the output sides of the capacitors $CC_1$ to $CC_3$ and the capacitors $CT_1$ to $CT_3$ are set to the reset potential $V_{CL}$ and the input sides of the capacitors $CC_1$ to $CC_3$ are set to the noise potential ($V_1$ here). In this instance, the terminal Phi-RES is at the L level and the output voltage of the amplifier $A_1$ is raised by the emitter current of the transistors $Q_{31}$ to $Q_{33}$.

When the terminal Phi-CL is set to the L level at time $t_3$ and the noise reading operation is finished at time $t_4$ and the input terminals $IN_1$, to $IN_3$ are set to the GND potential, the input sides of the capacitors $CC_1$ to $CC_3$ are set to the GND potential and the output sides of the capacitors $CC_1$ to $CC_3$ and the capacitors $CT_1$ to $CT_3$ are set to a potential ($V_{CL}-V_1$). The output potential of the amplifier $A_1$ also drops in correspondence to the potential fluctuation.

Subsequently, although the terminal Phi-RES is set to the H level, in the embodiment, in order to determine the clamping voltage of the clamping circuit at the front stage of the comparator $C_1$, the noise reading operation is again performed. Namely, when the terminal Phi-RES is set to the low level and the noise reading operation is again executed, the input sides of the capacitors $CC_1$ to $CC_3$ are set to the noise potential $V_1$ and the output sides of the capacitors $CC_1$ to $CC_3$ and the capacitors $CT_1$ to $CT_3$ are set to the potential $V_{CL}$. Although the output potential of the amplifier $A_1$ also rises in correspondence to the potential fluctuation, in this instance, by setting the terminal Phi-SH to the L level, the electric potential on the output side of the capacitor $C_{CL}$ is set to $V_{REF2}$ and the clamping voltage is specified.

After that, when the second noise reading operation is finished, the input sides of the capacitors $CC_1$ to $CC_3$ are set to the GND potential and the output sides of the capacitors $CC_1$ to $CC_3$ and the capacitors $CT_1$ to $CT_3$ are set to the electric potential ($V_{CL}-V_1$). The output potential of the amplifier $A_1$ also drops in correspondence to the potential fluctuation. The electric potential on the output side of the capacitor $C_{CL}$ is set to ($V_{REF2}-V_1$) When the signal including the noise is read out, the electric potential on the output side of the capacitor $C_{CL}$ is set to ($V_{REF2}-V_1+V_2$). Namely, in the second noise reading operation and the second reading operation of the signal including the noise, since the electric potentials of the capacitors $CT_1$ to $CT_3$ can be set to the same value, even a micro signal can be also accurately detected.

According to the peak detecting apparatuses of the invention as described above, when the peak value of the signals from the plurality of signal sources is detected, a peak detecting precision can be improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A peak detecting apparatus comprising:
   a plurality of input means for receiving respectively a plurality of signals;
   a plurality of first buffer means, to which the plurality of signals are respectively input from the plurality of input means and which respectively comprise an emitter-follower circuit, for buffering the plurality of signals;
   a plurality of second buffer means which are respectively electrically connected to said plurality of first buffer means, the respective outputs of said plurality of second buffer means being electrically connected together to detect a peak signal from among the plurality of signals;
   an output means for outputting the detected peak signal; and
   a dummy output unit comprising:
   a third buffer means, for buffering a voltage source;
   a fourth buffer means, electrically connected to said third buffer means, for detecting a buffered voltage signal from said third buffer means; and
   a dummy output means, electrically connected to said fourth buffer means, for outputting the buffered voltage signal, permitting a difference signal between the detected peak signal output from said output means and the buffered voltage signal output from said dummy output means to be generated.

2. A peak detecting apparatus comprising:

a plurality of input means for receiving respectively a plurality of signals;

a plurality of first buffer means, to which the plurality of signals are respectively input from the plurality of input means, for buffering the plurality of signals;

a plurality of second buffer means which are respectively electrically connected to said plurality of first buffer means, the respective outputs of said plurality of second buffer means being electrically connected together to detect a peak signal from among the plurality of signals;

an output means for outputting the detected peak signal; and a dummy output unit comprising:
   a third buffer means, for buffering a voltage source;
   a fourth buffer means, electrically connected to said third buffer means, for detecting a buffered voltage signal from the third buffer means; and
   a dummy output means, electrically connected to said fourth buffer means, for outputting the buffered voltage signal, permitting a difference signal between the detected peak signal output from said output means and the buffered voltage signal output from said dummy output means to be generated.

3. An apparatus according to claim 2, further comprising:

a plurality of reset means provided on an input side of said plurality of first buffer means to which the plurality of signals are respectively input, and differential processing means electrically connected to an output side of said dummy output unit, for eliminating an electric potential of said output means resulting from a reset potential of said plurality of reset means.

4. An apparatus according to claim 2, further having:

clamping means for clamping an output of said means; and comparing means for comparing a signal voltage from said clamping means to a reference voltage.

5. An apparatus according to claim 2, further comprising:

a plurality of capacitors serially and respectively connected to said input means; and a plurality of reset means respectively connected between each of said plurality of capacitors and an input side of each of said first buffer means to which the plurality of signals are respectively input.

6. An apparatus according to claim 5, further comprising differential processing means electrically connected to an output side of said dummy output unit, for eliminating an electric potential of said output means resulting from a reset potential of said plurality of reset means.

* * * * *

UNITED STATES PATENT AND TRADEMARK OFFICE
CERTIFICATE OF CORRECTION

PATENT NO. : 5,942,920
DATED : August 24, 1999
INVENTOR(S) : Isamu Ueno

It is certified that error appears in the above-identified patent and that said Letters Patent is hereby corrected as shown below:

In the Drawing Sheet, consisting of Figure 10, should be deleted and replaced with Figure 10, as shown on attached page.

FIG. 10
PRIOR ART

UNITED STATES PATENT AND TRADEMARK OFFICE
CERTIFICATE OF CORRECTION

PATENT NO. : 5,942,920
DATED : August 24, 1999
INVENTOR(S) : ISAMU UENO

It is certified that error appears in the above-identified patent and that said Letters Patent is hereby corrected as shown below:

<u>ON THE TITLE PAGE</u>

[56] In References Cited, under FOREIGN PATENT DOCUMENTS:
"362034416A" should read --62-034416--; and
under Attorney, Agent, or Firm: "Fitzpatrick Cella Harper & Scinto" should read --Fitzpatrick, Cella, Harper & Scinto--.

<u>COLUMN 4</u>

Line 53, "characteristics" should read --characteristic--.

<u>COLUMN 6</u>

Line 13, "$M_4$" should read --$M_5$--.

Signed and Sealed this

Twenty-sixth Day of September, 2000

Attest:

Q. TODD DICKINSON

*Attesting Officer*　　　　　*Director of Patents and Trademarks*